US009935079B1

(12) United States Patent
Foong et al.

(10) Patent No.: US 9,935,079 B1
(45) Date of Patent: Apr. 3, 2018

(54) LASER SINTERED INTERCONNECTIONS BETWEEN DIE

(71) Applicant: NXP USA, Inc., Austin, TX (US)

(72) Inventors: Chee Seng Foong, Austin, TX (US); Trent Uehling, New Braunfels, TX (US); Leo M. Higgins, III, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/372,482

(22) Filed: Dec. 8, 2016

(51) Int. Cl.
| | |
|---|---|
| H01L 23/00 | (2006.01) |
| H01L 25/065 | (2006.01) |
| H01L 23/31 | (2006.01) |
| H01L 23/498 | (2006.01) |
| H01L 21/48 | (2006.01) |
| H01L 21/56 | (2006.01) |
| H01L 23/48 | (2006.01) |

(52) U.S. Cl.
CPC .......... *H01L 24/83* (2013.01); *H01L 21/4853* (2013.01); *H01L 21/4867* (2013.01); *H01L 21/565* (2013.01); *H01L 23/3114* (2013.01); *H01L 23/481* (2013.01); *H01L 23/49838* (2013.01); *H01L 24/16* (2013.01); *H01L 24/27* (2013.01); *H01L 24/32* (2013.01); *H01L 25/0655* (2013.01); *H01L 2224/16227* (2013.01); *H01L 2224/27505* (2013.01); *H01L 2224/32137* (2013.01); *H01L 2224/8313* (2013.01); *H01L 2224/8384* (2013.01); *H01L 2924/2075* (2013.01)

(58) Field of Classification Search
CPC ...................................................... H01L 24/20
See application file for complete search history.

(56) References Cited

U.S. PATENT DOCUMENTS

| | | | |
|---|---|---|---|
| 5,739,579 | A | 4/1998 | Chiang et al. |
| 5,977,640 | A | 11/1999 | Bertin et al. |
| 6,921,968 | B2 | 7/2005 | Chung |
| 7,334,323 | B2 | 2/2008 | Egitto et al. |
| 7,956,442 | B2 | 6/2011 | Hsu et al. |
| 8,143,097 | B2 | 3/2012 | Chi et al. |
| 8,158,489 | B2 | 4/2012 | Huang et al. |

(Continued)

OTHER PUBLICATIONS

Scanlan et al., "Adaptive Patterning for Panelized Packaging," Deca Technologies, Inc., International Wafer Level Packaging Conference, 2012, 7 pages.

*Primary Examiner* — Lex Malsawma
*Assistant Examiner* — Gardner W Swan

(57) ABSTRACT

Embodiments of a microelectronic packaged device and methods of making are provided, where the microelectronic packaged device includes a system package comprising a first die and a second die, wherein the first die and the second die are laterally positioned to one another, and the first die and the second die are laterally separated from one another by mold compound; and a conductive trace formed between a first conductive surface on an exposed surface of the first die and a second conductive surface on an exposed surface of the second die, wherein the conductive trace is laser sintered directly on the first conductive surface, on a portion of the exposed surface of the first die, on a portion of a top surface of the mold compound, on a portion of the exposed surface of the second die, and on the second conductive surface.

13 Claims, 10 Drawing Sheets

(56) References Cited

U.S. PATENT DOCUMENTS

| | | |
|---|---|---|
| 8,216,918 B2 | 7/2012 | Gong et al. |
| 8,263,434 B2 | 9/2012 | Pagaila et al. |
| 8,264,077 B2 | 9/2012 | Chiou et al. |
| 8,513,767 B2 | 8/2013 | Kotlanka et al. |
| 8,647,979 B2 | 2/2014 | Yaniv et al. |
| 8,900,921 B2 | 12/2014 | Kim et al. |
| 9,202,792 B2 | 12/2015 | Yu et al. |
| 2002/0105073 A1* | 8/2002 | Smith ............... H01L 23/3121 257/730 |
| 2005/0062171 A1* | 3/2005 | Hung ............... H01L 23/49816 257/782 |
| 2011/0024888 A1 | 2/2011 | Pagaila et al. |
| 2011/0068444 A1 | 3/2011 | Chi et al. |
| 2012/0032340 A1 | 2/2012 | Choi et al. |
| 2012/0329212 A1* | 12/2012 | Leal ............... H01L 23/3135 438/110 |
| 2015/0163904 A1* | 6/2015 | Karhade ............... H01L 25/00 361/679.02 |
| 2015/0200177 A1* | 7/2015 | Foong ............... H01L 21/561 257/693 |
| 2015/0262931 A1 | 9/2015 | Vincent et al. |
| 2015/0328835 A1* | 11/2015 | Wu ............... B22F 3/1055 264/642 |
| 2016/0093525 A1 | 3/2016 | Cook et al. |
| 2016/0099231 A1 | 4/2016 | Yang et al. |

\* cited by examiner

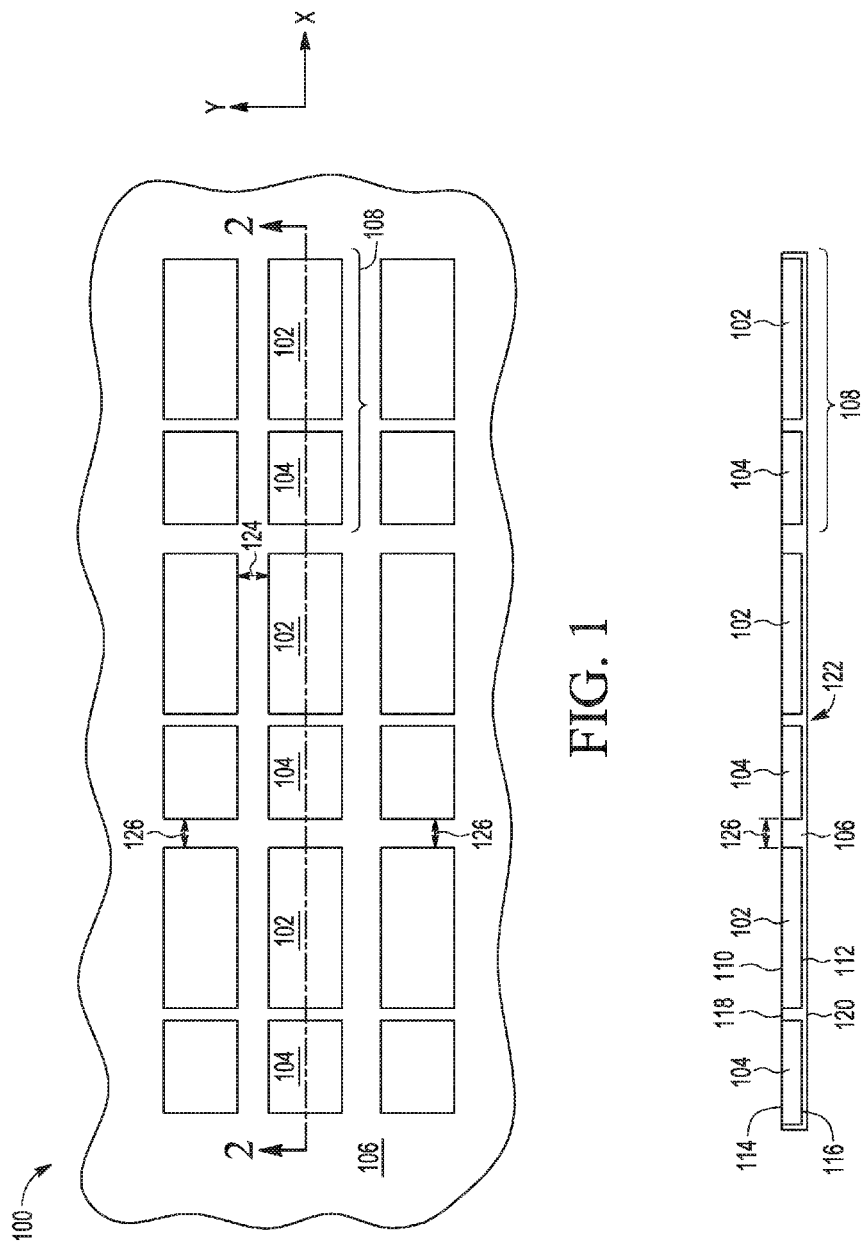

LASER SINTERED INTERCONNECTIONS BETWEEN DIE

BACKGROUND

Field

This disclosure relates generally to microelectronic packaging, and more specifically, to laser sintering interconnections between die.

Related Art

Conventional fan-out wafer level packaging (FOWLP) processes produce microelectronic packages having peripheral fan-out areas, which enlarge the surface area of the front side of the package over which a contact array can be formed. Examples of such packages include system-in-packages (SiP) containing multiple microelectronic components, which are interconnected by redistribution layers formed over the molded package body. For example, a SiP package may include multiple surface mounted devices (SMDs) in addition to one or more semiconductor die. While enhancing the functionality of the package, the inclusion of multiple microelectronic components or semiconductor die in a single package may cause an increase in the number of redistribution layers, the wiring density of the redistribution layers, or both. Such increases may also increase package height and introduce additional cost, complexity, and delay into the package fabrication process. Additionally, higher distribution layer counts and higher wiring densities often increase the likelihood of redistribution layer delamination during or after fabrication of the package.

BRIEF DESCRIPTION OF THE DRAWINGS

The present invention may be better understood, and its numerous objects, features, and advantages made apparent to those skilled in the art by referencing the accompanying drawings.

FIG. 1-12 illustrate block diagrams depicting an example laser sintered interconnection process flow in which the present disclosure is implemented, according to some embodiments.

The present invention is illustrated by way of example and is not limited by the accompanying figures, in which like references indicate similar elements, unless otherwise noted.

Figure 3:
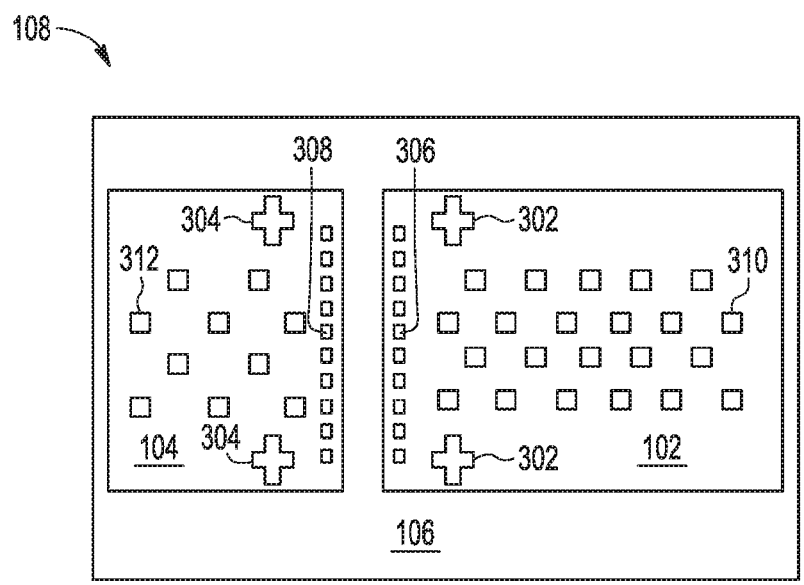

Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

The present disclosure provides a laser sintered interconnection system and process for forming ultra-fine conductive traces as a redistribution layer over surfaces of a system package. The present disclosure is capable of achieving 1 micron wide conductive traces having a 1 micron pitch, which achieves increased density interconnections between components of a system package in a single layer. The present disclosure provides that conductive traces are formed between bonding surfaces exposed in either an active surface or a backside surface of a first die and bonding surfaces exposed in either an active surface or a backside surface of a second die. The bonding surfaces may be a standard bond pad or may be an exposed surface of an underlying metal layer. For example, a top surface of a via may be exposed as a bonding surface, where the resulting bonding surface may be 100 to 500 times smaller than the surface of the bond pad. The conductive trace may also provide connections that are routed vertically down from either the active surface or the backside surface of a die, which may free-up real estate in the back-end-of-line (BEOL) metal layers for other structures, reduce BEOL congestion, and possibly reduce BEOL metal layer counts.

The laser sintered interconnection system and process uses a vision system to locate bonding surfaces and align the laser source to form conductive traces between the bonding surfaces. Based on the information obtained by the vision system, the laser sintering system is capable of recalculating new trajectories of target interconnect paths between bonding surfaces, despite any misalignment of the die due to the die being similarly or differently sized, die tilt, non-coplanar bonding surfaces (e.g., dishing or other step height may be present), or other reconstituted wafer or panel process variation. The use of the vision system also achieves a mask free process, where the alignment and position accurate of the die in the reconstituted wafer or panel is no longer critical.

The present disclosure is beneficial for high I/O components, which are limited by the routing capability of conventional substrate technologies. The present disclosure is especially beneficial for system-in-packages (SiP) in 2D, 2.5D, and 3D packaging systems, which achieves improved design flexibility, lower design costs, and faster product-to-market timelines. Additionally, the present disclosure avoids the use of expensive silicon or glass-based interposers, which also reduces costs while achieving the same functional requirements for SiP.

Example Embodiments

FIG. 1 illustrates a top-down view of an array panel 100, which includes a plurality of system packages 108 arranged in an array in both X and Y directions. Each system package 108 is a microelectronic system that includes various microelectronic components, which are embedded in or placed on top of a carrier media, such as mold compound 106, as a single module or package. The multiple system packages 108 are connected to one another by mold compound 106 to form the single array panel 100. The system packages 108 are laterally spaced apart from one another in the array panel 100 by a consistent spacing in the X direction (shown as spacing 126) and in the Y direction (shown as spacing 124). The array panel 100 also includes a number of saw lanes located between the system packages 108 (e.g., in the spacings 124 and 126) which are used to singulate the system packages 108. Array panel 100 may be implemented as a reconstituted wafer or other shaped panel (e.g., circular or rectangular shaped).

In the embodiments discussed herein, each system package 108 includes at least a first semiconductor die 102 (referred to herein as simply die 102) and a second semiconductor die 104 (referred to herein as simply die 104) that are laterally positioned to one another (e.g., both are located side by side in the XY plane). In some embodiments, the first semiconductor die 102 is a logic die that includes active circuitry for implementing logic functions, and the second semiconductor die 104 is a memory die that includes active circuitry for implementing memory functions. In some embodiments, die 102 and 104 are implemented as integrated circuits or chips that include a number of integrated circuit components. Die 102 and 104 may be of a same size or may be differently sized (e.g., one die may be larger than the other). The microelectronic components, including die 102 and 104, have at least one bonding surface exposed in the mold compound 106 to which a laser sintered interconnection can be made, as further discussed below. In the embodiments discussed herein, one or more of die 102 and die 104 is a flip chip die having flip chip bond pads.

Mold compound 106 is an electrically insulating material that surrounds the various microelectronic components of the system package 108. Examples of mold compound 106 include but are not limited to a material including polymer materials based on a biphenyl type or multi-aromatic type epoxy resin, which may be heat or light curable or may not require a curing step, may include filler material, or other types of encapsulating materials having a viscosity suitable for encapsulation techniques, such as injection molding technique, transfer molding technique, or compression molding technique.

The active circuitry described herein for die 102 and 104 may be implemented on a semiconductor substrate, which can be any semiconductor material or combinations of materials, such as gallium arsenide, silicon germanium, silicon-on-insulator (SOI), silicon, monocrystalline silicon, the like, and combinations of the above. The active circuitry for each die 102 and die 104 includes integrated circuitry formed using a sequence of numerous process steps performed on one or more semiconductor wafers from which die 102 and die 104 are singulated, including but not limited to depositing semiconductor materials including dielectric materials (e.g., electrically insulating thin film materials) and metals (e.g., electrically conducting materials), such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components and microelectronic components include but are not limited to a processor, memory (volatile and non-volatile), logic, analog circuitry, sensor, MEMS (microelectromechanical systems) device, a standalone discrete or passive device such as a resistor, inductor, capacitor, diode, power transistor, and the like. In some embodiments, the active circuitry may be a combination of the components listed above or may be another type of microelectronic device.

FIG. 2 illustrates a cross-sectional view of array panel 100 at line 2. Each die 102 has an active surface 110 at which its active circuitry is located, and an opposing backside surface 112 that is embedded in mold compound 106. Each die 104 has an active surface 114 at which its active circuitry is located, and an opposing backside surface 116 that is embedded in mold compound 106. A portion 122 of the mold compound is located between die 102 and die 104 in each system package 108, which has a top surface 118 and a bottom surface 120. In the embodiment shown, active surfaces 110 and 114 are exposed in the mold compound 106, where top surface 118 is coplanar with active surfaces 110 and 114. Any additional microelectronic components that are to be interconnected with one or more of die 102 and 104 also have its bond pads or other bonding surfaces exposed in the mold compound 106. It is noted that die 102 and 104 are preferable located as close to each other as allowed by the array panel 100 process capability, to provide a shortest possible interconnection.

Figure 4:
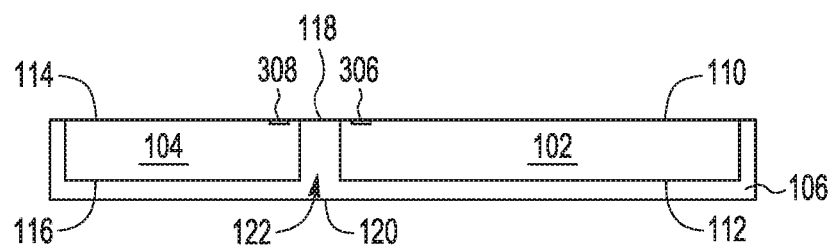

FIG. 3 illustrates a top-down view and FIG. 4 illustrates a cross-sectional view of a single system package 108, which may be provided in panel form (e.g., included as part of array panel 100) or in singulated form (e.g. separated from array panel 100). In the embodiments discussed herein, the laser sintered interconnection process shown in FIG. 5-12 is applied to one or more system packages 108, such as by being applied to multiple system packages 108 that are included as part of an array panel 100 (e.g., the system packages 108 are still connected to one another by mold compound 106 to form array panel 100) or being applied individually to system packages 108 in singulated form (e.g., the system packages 108 are separated from one another after the array panel 100 is sawed into individual system packages 108). In both cases, the laser sintered interconnection process may be applied in parallel to multiple system packages 108, whether still connected in panel form or arranged in an array in singulated form (e.g., on a temporary carrier or tape).

System package 108 is in a face-up orientation in FIGS. 3 and 4, which shows active surface 110 of die 102 and active surface 114 of die 104 exposed in the mold compound 106 and coplanar with top surface 118 of the portion 122 of mold compound between die 102 and 104. Die 102 includes two or more fiducial marks 302, a set of bond pads 306, and a set of bond pads 310 and on active surface 110. Die 104 includes two or more fiducial marks 304, a set of bond pads 308, and a set of bond pads 312 on active surface 114. Fiducial marks 302 and 304 are visual features that are etched or otherwise shaped into the active surfaces 110 and 114 of die 102 and 104. The fiducial marks 302 and 304 are formed during the same processes that form active circuitry of die 102 and 104. For example, fiducial marks 302 and 304 may be shapes etched into one or more dielectric layers in areas of the active surfaces 110 and 114 between active circuitry. For simplicity's sake, the fiducial marks 302 and 304 and sets of bond pads 310 and 312 are not shown in FIG. 4. It is noted that other details have been omitted from the Figures herein that are well known in the art, such as a passivation layer formed in between the bond pads and a metallization layer or wettable coating formed on each bond pad of die 102 and 104.

The set of bond pads 306 on die 102 and the set of bond pads 308 on die 104 serve as interconnection pads, where laser sintered interconnections (also referred to as simply interconnects or conductive traces) are formed between the two die at the interconnection pads. As such, the interconnection pads 308 are located along an edge of die 104 that is nearest die 102, and the interconnection pads 306 are located along an edge of die 102 that is nearest die 104. In embodiments where either die 104 or die 102 or both are to be further connected to other microelectronic components, another set of interconnection pads are located along an edge of the respective die that is nearest the microelectronic component to which interconnects are to be made. While interconnection pads 306 and 308 are illustrated as being located along die edges in a straight line, pads 306 and 308 may be located in other arrangements in other embodiments (e.g., offset in alternating rows like pads 310 and 312).

In the embodiment shown, the sets of interconnection pads 306 and 308 are formed using a same or similar process to form the sets of other bond pads 310 and 312. In some embodiments, the sets of interconnection pads 306 and 308 are formed from a same conductive metal as the sets of bond pads 310 and 312. Examples of such a conductive metal include but are not limited to copper, gold, nickel, aluminum, silver, an alloy or a composite of one or more suitable conductive metals, or other suitable conductive material or combination of materials. In some embodiments, the interconnection pads 306 and 308 and bond pads 310 and 312 each have a same surface area dimension (e.g., a same length and width). In other embodiments, the interconnection pads 306 and 308 have a smaller surface area dimension than bond pads 310 and 312, due to the ultra-fine nature of the interconnects formed on interconnection pads 306 and 308 requiring a smaller bonding area (e.g., the width of the laser beam that forms the interconnects), as compared to the bonding area required for bond pads 310 and 312 (e.g., the width of the solder bumps formed for flip chip connections).

Figure 5:
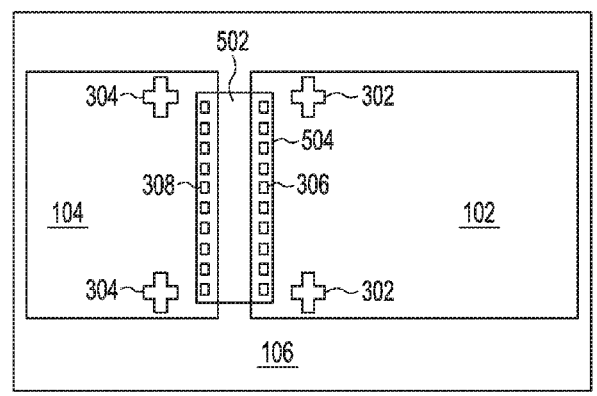
Figure 6:
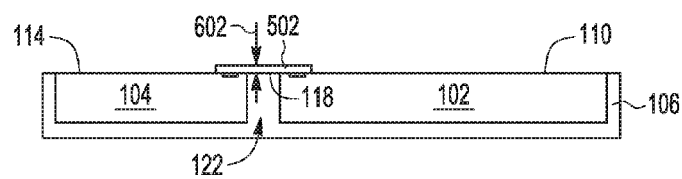

FIG. 5 illustrates a top-down view and FIG. 6 illustrates a cross-sectional side view of system package 108. For simplicity's sake, the sets of other bond pads 310 and 312 are not shown in FIG. 5-12. FIG. 5 shows one step of the laser sintered interconnection process, where a conductive nanoparticle paste 502 is applied to surfaces of interconnection pads 306, surfaces of interconnection pads 308, and target interconnect paths between pads 306 and 308 along which interconnects or conductive traces are to be formed. In the embodiment shown in FIG. 5, the nanoparticle paste 502 is applied over an area 504 in which pads 306 and 308 and target interconnect paths are located, which includes portions of the active surface 110 of die 102, the top surface 118 of portion 122, and the active surface 114 of die 104. The nanoparticle paste 502 can be applied by spaying, slot die coating, ink jetting, tape lamination, or other appropriate deposition manner.

The original target interconnect paths are provided by a user as a netlist or desired layout, which is utilized by the laser sintering system to form the conductive traces between pads 306 and 308. It is noted that a preferred embodiment includes target interconnect paths in the form of straight lines to provide the shortest interconnect length of the conductive traces between pads 306 and 308. However, other embodiments provide that target interconnect paths may be in any shape or layout that may be achieved by laser sintering (e.g., paths that include multiple turns, jogs in different directions, non-parallel lines, non-linear paths, and the like).

The conductive nanoparticle paste 502 includes nanoparticles of conductive metal suspended in a liquid (such as deionized water) that is vaporized during laser sintering, as discussed below in connection with FIG. 9. Examples of the conductive metal nanoparticles include but are not limited to copper, aluminum, silver, gold, an alloy or a composite of one or more suitable conductive metals, and the like. The consistency or viscosity of the nanoparticle paste 502 is thick enough to prevent the nanoparticle paste 502 from any undesired spreading away from the target interconnect paths, as well as achieve a thickness or height 602 of the resulting conductive traces.

Figure 7:
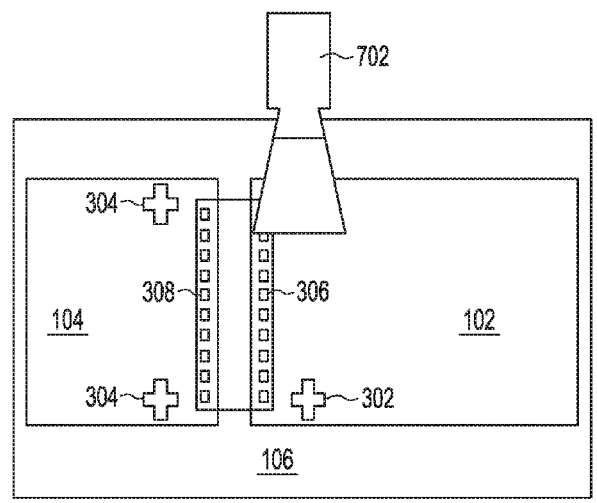
Figure 8:
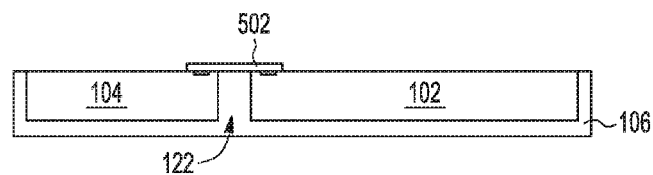

FIG. 7 illustrates a top-down view and FIG. 8 illustrates a cross-sectional side view of system package 108 in a subsequent step of the laser sintered interconnection process, where a vision system 702 locates the fiducial marks 302 and 304 in order to determine a position of the active surfaces 110 and 114 of die 102 and 104 relative to one another. Vision system 702 includes a video camera aimed at the active surfaces 110 and 114 of die 102 and 104, and image recognition software that identifies the fiducial marks 302 and 304. Vision system 702 determines a location of the interconnection pads 306 on active surface 110 relative to a location of interconnection pads 308 on active surface 114. Vision system 702 ensures that the laser sintering system (discussed below) is properly aligned to pads 306 and 308 in order to form conductive traces between pads 306 and 308. Vision system 702 ensures that the conductive traces are correctly formed between pads 306 and 308, despite any misalignment between die 102 and 104 that may occur during formation of the array panel 100 (e.g., die tilt, height variation) or in attachment of die 102 and 104 to a temporary carrier tape.

Figure 9:
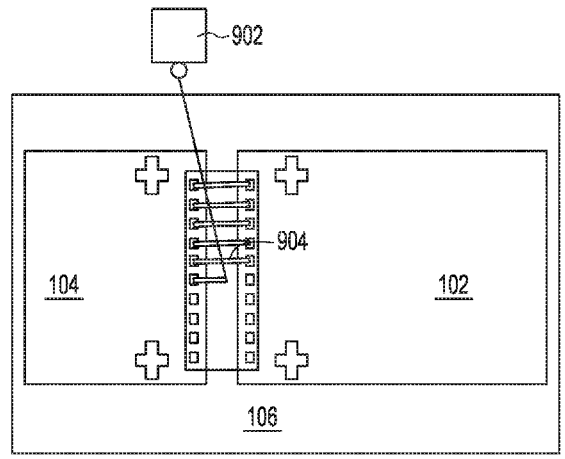
Figure 10:
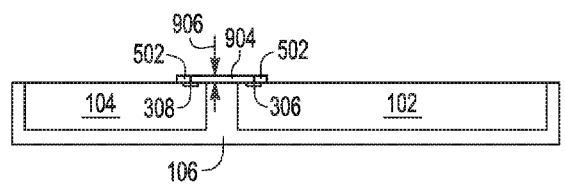

FIG. 9 illustrates a top-down view and FIG. 10 illustrates a cross-sectional side view of system package 108 in a subsequent step of the laser sintered interconnection process, where a laser sintering system 902 forms one or more conductive traces 904 substantially along the target interconnect paths between pads 306 and 308. Using the location information obtained by vision system 702, laser sintering system 902 directs a laser beam to raster or vector over a target interconnect path between a respective one of pads 306 and a respective one of pads 308 according to the netlist or desired layout. The laser applies heat below the melting point of the conductive metal to the conductive paste 502 along each target interconnect path, which fuses the nanoparticles of conductive metal along the paths into a conductive trace 904 between the respective pad 306 and pad 308. The laser sintering system 902 is capable of forming ultra-fine conductive traces with a width as small as 1 micron (e.g., width measured in the XY plane), and achieving a spacing or pitch between traces as small as 1 micron. The length of the conductive traces may be any length needed, such as being on the order of 10 microns, and may be as long as 20 microns.

Each conductive trace 904 fuses with (or bonds to) the surface of the respective pad 306 and the surface of the respective pad 308, forming an electrical interconnection between the respective pad 306 and pad 308. The resulting height 906 of the conductive trace 904 is substantially the height 602 of the conductive paste 502. An example value of height 602 is between 0.3 to 0.6 microns. It is noted that the interconnect paths achieved by laser sintering system 902 may differ from the original target interconnect paths, relative to the positions of pads 306 and 308, depending on the amount of misalignment between die 102 and 104 that may occur during formation of the array panel 100 or in attachment of die 102 and 104 to a temporary carrier tape. In other words, laser sintering system 902 is capable of performing on-the-fly modification of the original target interconnect paths, as needed.

In another embodiment of laser sintering system 902, an intense pulsed light (IPL) flash lamp may be used to sinter the conductive traces on the system packages 108 at once. In such an embodiment, the conductive paste 502 (shown in FIGS. 5 and 6) may be patterned to form target interconnect paths between pads 306 and 308, or may be deposited by ink jet or other means only along the target interconnect paths. In some embodiments, the conductive paste 502 is patterned or deposited using information obtained by vision system 702 (e.g., the step illustrated in FIG. 5 occurs after the step illustrated in FIG. 7), in order to form modified target interconnect paths that will achieve correctly formed conductive traces, despite any misalignment between die 102 and 104. Once the target interconnect paths are formed in conductive paste 502, the IPL flash lamp sinters the conductive paste 502 into conductive traces 904. Such an embodiment does not require a rinsing step (like that illustrated in FIG. 11), although one may still be performed in other embodiments.

The routing achieved by the conductive traces 904 over the active surfaces 110 and 114 and top surface 118 may also be referred to as a redistribution layer. It is noted that each conductive trace 904 is formed directly on the active surfaces 110 and 114 and top surface 118 without requiring any dielectric material underlying the conductive traces 904, which minimizes the overall height of the redistribution layer and reduces the likelihood of delamination of the redistribution layer from the system package 108. It is also noted that in other embodiments, additional conductive traces may be formed one over another as part of the redistribution layer. In such embodiments, a dielectric layer is deposited over first conductive traces formed directly on the active surfaces 110 and 114 and top surface 118, and second conductive traces are then formed over the dielectric layer, and so on. In embodiments that implement die 102 and 104 as flip chip die, the overall height of the redistribution layer (which in the embodiment of FIG. 10 is shown as height 906 of conductive trace 904) is less than the height of the flip chip bumps joined to the other pads 310 and 312 on die 102 and 104, as shown below in connection with FIG. 13.

While the discussion provided herein often refers to formation of a single conductive trace 904, it is noted that the details provided regarding the formation of a single conductive trace is also applicable to formation of multiple conductive traces 904. In some embodiments, the laser sintering may be performed in parallel, which may be beneficial to form a conductive trace having a particular path shape on each system package 108 in parallel at one time, or to form multiple conductive traces that are parallel to one another on a single system package 108 at one time. Such embodiments may use multiple laser beam generators or IPL flash lamps, or may use mirrors to split the laser beam into multiple laser beams for sintering in parallel.

Figure 11:
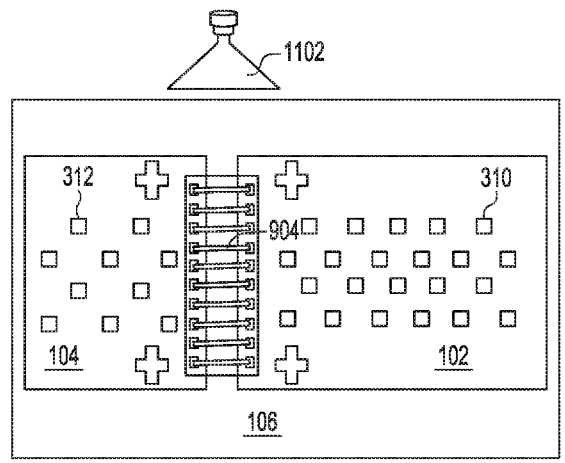
Figure 12:
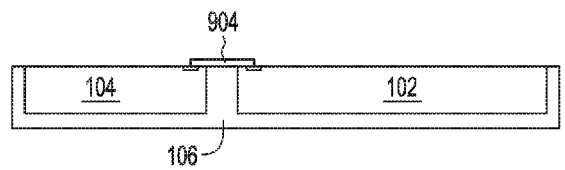

FIG. 11 illustrates a top-down view and FIG. 12 illustrates a cross-sectional side view of system package 108 in a subsequent step of the laser sintered interconnection process, where a rinsing system 1102 removes any remaining nanoparticle paste 502 (e.g., using deionized water or other rinsing solvent at a high pressure) from the active surfaces 110 and 114 of die 102 and 104 and the top surface 118 of portion 122, leaving conductive traces 904 intact. In some embodiments, a thin dielectric coating, such as polyimide or other polymer material, may then be applied over the conductive traces.

Figure 13:
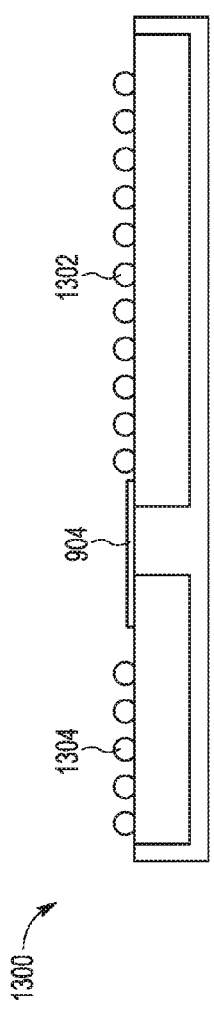
FIG. 13-14 illustrate block diagrams depicting an additional packaging process flow for a package that includes laser sintered interconnections between die, according to some embodiments.

FIG. 13 illustrates a cross-sectional view of system package 108 in a subsequent packaging step after the laser sintered interconnection process, where sets of flip chip bumps 1302 1304 are respectively formed on surfaces of pads 310 and 312 on the active surfaces 110 and 114 of die 102 and 104, such as by electroplating. As shown, the height of the flip chip bumps 1302 and 1304 are greater than the height of the conductive traces 904, to ensure that conductive traces 904 are not damaged during substrate attachment, discussed below. Examples of flip chip bumps 1302 and 1304 include, but are not limited to, C4 bumps, balls, pillars, studs, and the like. Flip chip bumps 1302 and 1304 are made from a conductive material, examples of which include, but are not limited to, solder, copper, gold, nickel, aluminum, alloys of such metals, or other suitable conductive material or combination of materials. Flip chip bumps 1302 and 1304 may be made of the same conductive metal or may be made of a different conductive metal than the bond pads on which the bumps are formed.

Figure 14:
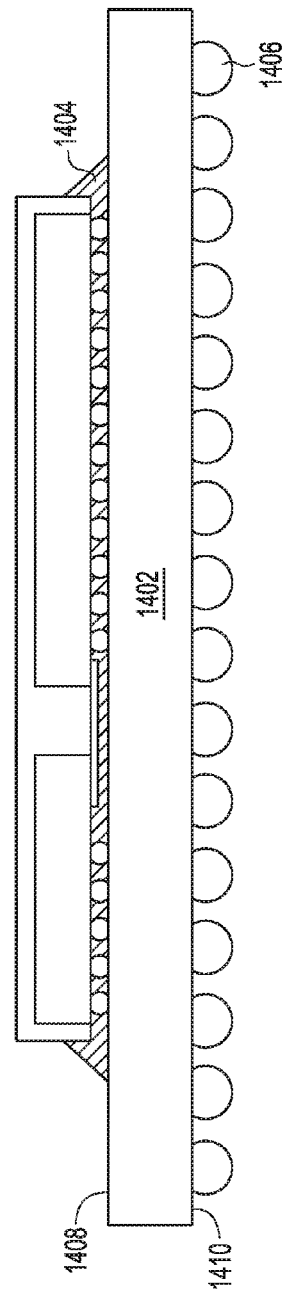

FIG. 14 illustrates a cross-sectional view of system package 108 in a subsequent packaging step, where system package 108 is mounted face-down to a substrate 1402. A reflow process is performed to join the flip chip bumps 1302 and 1304 to respective pads on a top surface 1408 of substrate 1402. An underfill process is then performed to inject or otherwise provide encapsulant material 1404 in the space between system package 108 and substrate 1402 to cover and protect flip chip bumps 1302 and 1304 and conductive traces 904. A number of solder balls 1406 are also attached to respective pads on a bottom surface 1410 of substrate 1402 (e.g., solder ball placement and reflow). In embodiments where system package 108 is part still of array panel 100, the resulting package (which includes array panel 100 and substrate 1402) is saw singulated into individual system packages.

In some embodiments, substrate 1402 is made of organic material (e.g., polymers, synthetic rubbers) that includes conductive structures and insulating materials, such as plating, pads, interconnects, vias for providing electrical connections from a device like system package 108 (including die 102 and die 104) to external conductive package structures such as solder balls 1406, and the like. Examples of substrate 1402 include, but are not limited to, a ball grid array (BGA), a pin grid array, an in-line package, a flat package, a chip carrier, and the like. Examples of encapsulant material 1404 include but are not limited to polymer materials such as epoxies, which may be heat or light curable or may not require a curing step, or other materials having a viscosity suitable for underfill dispensing techniques, such as dam and fill dispensing technique or glob top dispensing technique.

Figure 15:
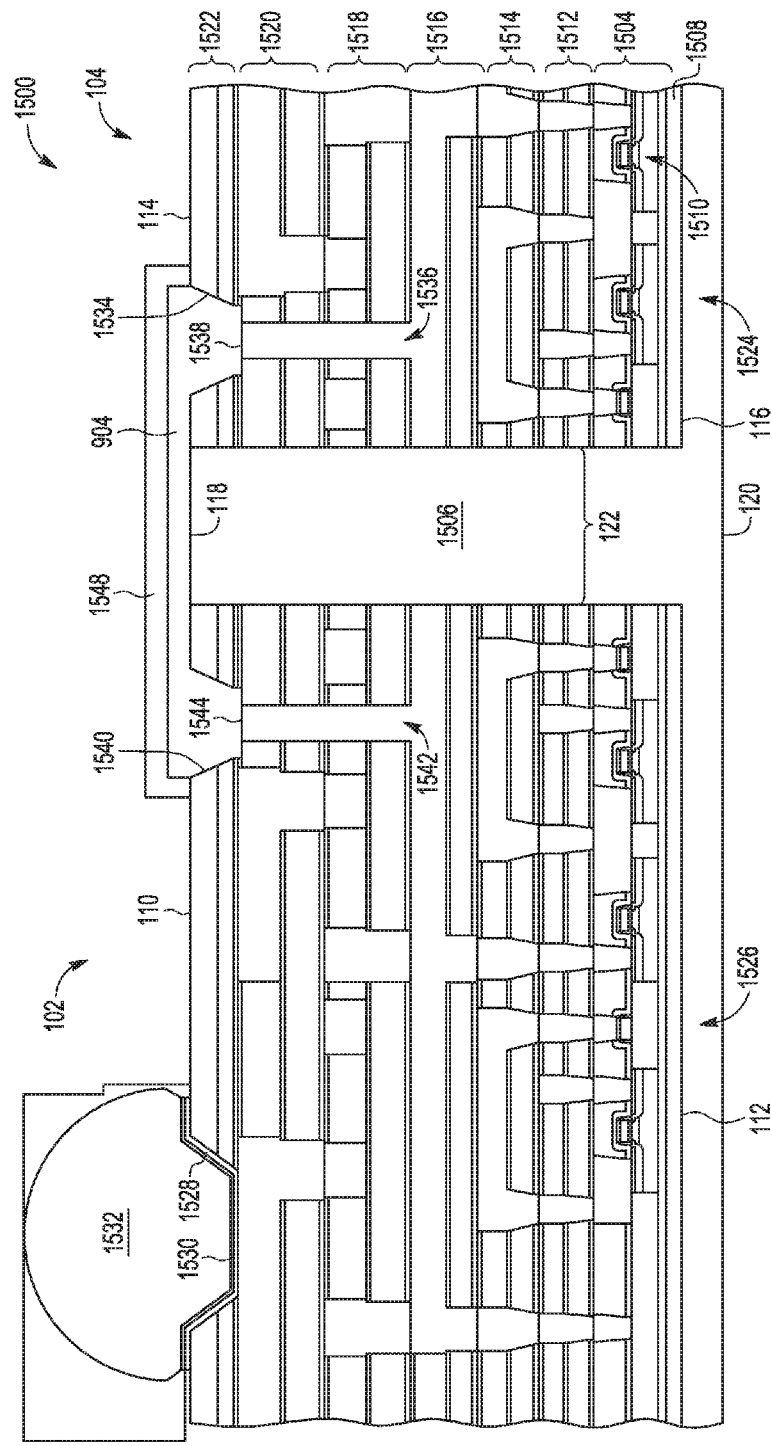
FIGS. 15 and 16 illustrate block diagrams depicting examples of laser sintered interconnections between die, according to some embodiments.

FIG. 15 illustrates a cross-sectional view of a system package 1500 that includes another embodiment of a conductive trace 904 between die 102 and die 104. System package 1500 is in a face-up orientation, which shows active surface 110 of die 102 and active surface 114 of die 104 exposed in the mold compound 1506 (which is analogous to mold compound 106) and coplanar with top surface 118 of the portion 122 of mold compound between die 102 and 104. A backside surface 112 of die 102 and a backside surface 116 of die 104 are embedded in mold compound 1506, where mold compound 1506 has a bottom surface 120.

Die 102 and 104 both include a number of metal layers 1512 (e.g., M1 layer, also referred to as a first metal layer), 1514 (e.g., M2 layer), 1516 (e.g., M3 layer), 1518 (e.g., M4 layer), and 1520 (e.g., M5 layer, also referred to as a last metal layer), in which a three dimensional inner network of electrical connections and surrounding dielectric (also referred to as an inner net) are formed within the metal layers of each die. Die 102 has inner net 1526 and die 104 has inner net 1524, each of which extend from a semiconductor device layer 1504 to a passivation layer 1522. The metal layers 1512-1520 are sequentially deposited during a back-end-of-line (BEOL) process to form the inner nets 1526 and 1524, from deposition of the first metal layer to the subsequent deposition of the laser metal layer. Semiconductor device layer 1504 is formed on a remaining portion of semiconductor wafer 1508 (also referred to as silicon 1508), which includes a number of semiconductor devices (e.g., transistors) formed in various semiconductor materials. The passivation layer 1522 includes one or more layers of passivation material at the active surfaces 110 and 114 that includes openings 1528 to expose surfaces of bond pads 1530 in the last metal layer 1520, where pads 1530 are large enough for flip chip bumps 1532 to be attached. Pads 1530 are analogous to pads 310 and 312 discussed above.

In the embodiment shown, additional openings 1540 and 1534 are created in the passivation layer 1522 of die 102 and 104 to expose top surfaces 1544 and 1538 at the last metal layer 1520 of inner nets 1526 and 1524, respectively, where the top surfaces 1544 and 1538 each provide a bonding surface to which a conductive trace 904 is fused. In the embodiment shown, the openings 1540 and 1534 expose surfaces 1544 and 1538 of underlying vias 1542 and 1536, each of which provide a bonding surface that is much smaller than the bonding surface provided by pad 1530. Additionally, vias 1542 and 1536 provide vertical electrical connections into inner nets 1526 and 1542. Vias 1542 and 1536 may be formed at any depth into the inner nets 1526 and 1524 (e.g., formed during the same processes that form active circuitry of die 102 and 104) to connect the conductive trace 904 to any one of metal layers 1512-1520 or to any semiconductor device at device layer 1504. It is noted that the stacked portions of metal layers that form each via have different widths in each metal layer, where the width is narrower in the first metal layer than in the last metal layer. In some embodiments, via surfaces like top surfaces 1544 and 1538 may have a 10 micron width, while openings 1540 and 1534 have a 20 micron width to ensure the conductive trace lands properly on the via surfaces. Vias 1542 and 1536 may be specifically designed into the inner nets 1526 and 1542, in order to capitalize on the use of conductive traces that route an interconnection vertically down from the active surface of the die.

A conductive trace 904 is formed between top surfaces 1544 and 1538 at active surfaces 110 and 114, using the same laser sintered interconnection process discussed above. In the embodiment shown, a dielectric layer 1548 is formed over the conductive trace 904, which not only protects the conductive trace, but also provides an additional surface over which to form additional conductive traces in some embodiments. While FIG. 15 illustrates a conductive trace 904 formed between top surfaces 1544 and 1538 of vias 1542 and 1536, other embodiments include a conductive trace 904 formed between a bond pad (e.g., as part of a standard pad layout) on one of die 102 and 104 that is in a face-up orientation and a top surface of a via on the other of die 102 and 104 that is in a face-up orientation. It is noted that a metallization layer or wettable coating may be formed on each bonding surface of die 102 and 104 before the conductive trace is sintered.

Figure 16:
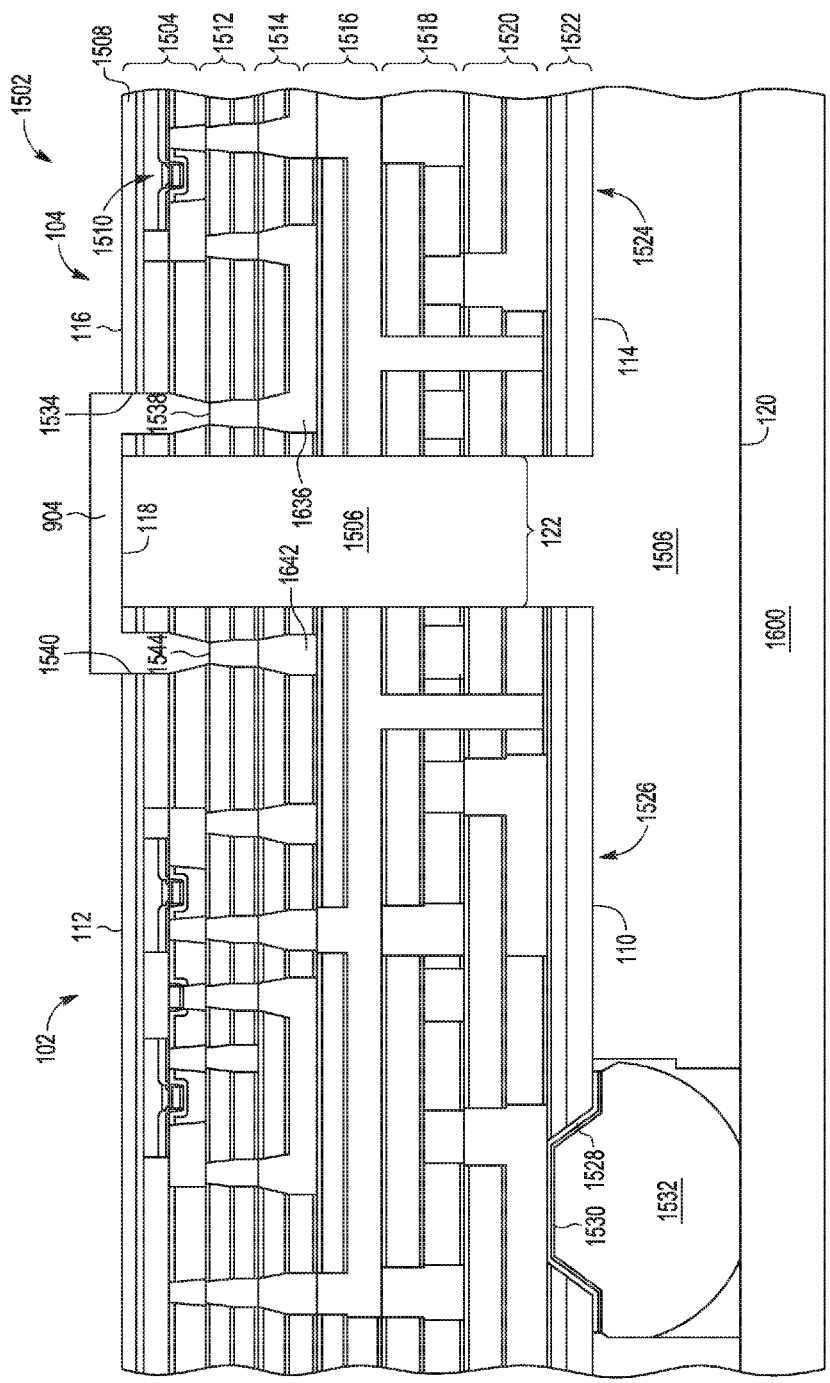

FIG. 16 illustrates a cross-sectional view of a system package 1502 that includes another embodiment of a conductive trace 904 between die 102 and die 104. System package 1502 is in a face-down orientation, which shows active surface 110 of die 102 and active surface 114 of die 104 facing downward and embedded in mold compound 1506. A backside surface 112 of die 102 and a backside surface 116 of die 104 are exposed in the mold compound 1506 and coplanar with top surface 118 of the portion 122 of mold compound between die 102 and 104. Mold compound 1506 has a bottom surface 120 that is in contact with a substrate 1600, to which solder balls 1532 are electrically connected.

In the embodiment shown, additional openings 1540 and 1534 are created through the remaining portion of semiconductor wafer 1508 and device layer 1504 of die 102 and 104 to expose top surfaces 1544 and 1538 at the first metal layer 1512 of inner nets 1526 and 1524, respectively, where the top surfaces 1544 and 1538 each provide a bonding surface to which a conductive trace 904 is fused. In the embodiment shown, the openings 1540 and 1534 expose surfaces 1544 and 1538 of underlying vias 1642 and 1636, each of which provide a bonding surface that is much smaller than the bonding surface provided by pad 1530. Due to the nature of the stacked portions of metal layers that form the vias, vias 1642 and 1636 are narrower in the first metal layer 1512 than at subsequent metal layers 1514-1520. As such, the top surfaces of vias 1642 and 1636 provide smaller bonding surfaces than top surfaces of vias 1542 and 1536. Additionally, vias 1642 and 1636 provide vertical electrical connections into inner nets 1526 and 1524. Vias 1642 and 1636 may be formed at any depth into the inner nets 1526 and 1524 (e.g., formed during the same processes that form active circuitry of die 102 and 104) to connect the conductive trace 904 to any one of metal layers 1512-1520 or to any semiconductor device at device layer 1504.

A conductive trace 904 is formed between top surfaces 1544 and 1538 at backside surfaces 112 and 116, using the same laser sintered interconnection process discussed above. In some embodiments, a dielectric layer may formed over the conductive trace 904 or over the entire backside surfaces 112 and 116 (as discussed below), which not only protects the conductive traces, but also provides an additional surface over which to form additional conductive traces. While FIG. 16 illustrates a conductive trace 904 formed between top surfaces 1544 and 1538 of vias 1642 and 1636, other embodiments include a conductive trace 904 formed between a bond pad (e.g., as part of a standard pad layout) on one of die 102 and 104 that is in a face-up orientation (e.g., with its active surface facing up) and a top surface of a via on the other of die 102 and 104 that is in a face-down orientation (e.g., with its active surface facing down). It is noted that a metallization layer or wettable coating may be formed on each bonding surface of die 102 and 104 before the conductive trace is sintered.

Figure 17:
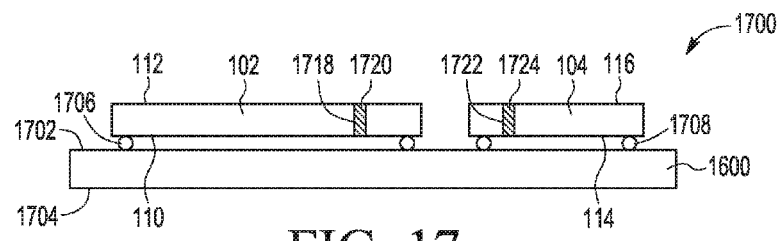
FIG. 17-23 illustrate block diagrams depicting another example laser sintered interconnection process flow in which the present disclosure is implemented, according to some embodiments.

FIG. 17-23 illustrate block diagrams depicting another example laser sintered interconnection process flow. FIG. 17 illustrates a cross-sectional view of microelectronic components, including die 102 and 104, of a system package 1700 that are mounted to substrate 1600. In the embodiment shown, die 102 and 104 are flip chip die that have active surfaces 110 and 114 mounted face-down to substrate 1600, where flip chip bumps (represented by flip chip bumps 1706 and 1708) are joined to respective pads on the top surface 1702 of substrate 1600. Die 102 and 104 are positioned laterally to one another. Die 102 and 104 each have a via in its respective inner net (represented by via 1718 and 1722), where a conductive trace is to be formed between a top surface 1720 of via 1718 that is exposed in backside surface 112 of die 102 and a top surface 1724 of via 1722 that is exposed in backside surface 116 of die 104. Substrate 1600 is analogous to substrate 1402.

Figure 18:
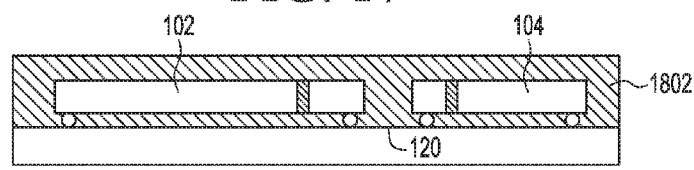

FIG. 18 illustrates a cross-sectional view of a subsequent step, where an over-molding process is performed to encapsulate the microelectronic components including die 102 and 104 with mold compound 1802. Mold compound 1802 is an electrically insulating material, analogous to mold compound 106. Mold compound 1802 has a bottom surface 120 formed in contact with the top surface 1702 of substrate 1600.

Figure 19:
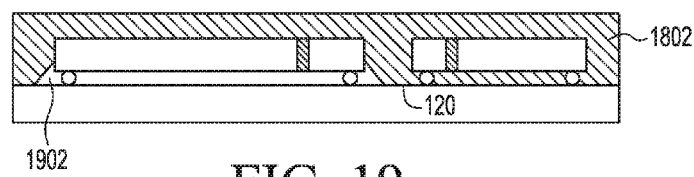

FIG. 19 illustrates a cross-sectional view of an alternative embodiment of the step shown in FIG. 18. FIG. 19 shows an underfill process is performed to inject or otherwise provide encapsulant material 1902 (which is analogous to encapsulant material 1404) in the space between die 102 and substrate 1600 to cover and protect flip chip bumps 1706. While FIG. 19 shows that the underfill process is applied to die 102, the underfill process may be applied to both die 102 and 104. An over-molding process is then performed to encapsulate the microelectronic components including die 102 and 104 with mold compound 1802, which has a bottom surface 120 in contact with the top surface 1702 of substrate 1600. The resulting mold compound 1802 that encapsulates the microelectronic components may also be referred to as a package body.

Figure 20:
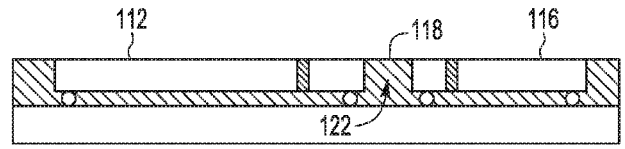

FIG. 20 illustrates a cross-sectional view of a subsequent step, where planarization or mold top-side grinding is performed on the system package (which may be either system package illustrated in FIG. 18 or FIG. 19) to remove a portion of the mold compound 1802 (or a top portion of the package body) to expose backside surfaces 112 and 116, and to form a top surface 118 of a portion 122 of mold compound 1802 between die 102 and 104 that is substantially coplanar with surfaces 112 and 116.

Figure 21:
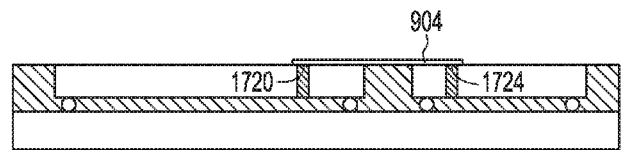

FIG. 21 illustrates a cross-sectional view of a subsequent step, where at least one conductive trace 904 is formed between top surfaces 1720 and 1724 at backside surfaces 112 and 116 in a manner like that shown in FIG. 16, using the same laser sintered interconnection process discussed above.

Figure 22:
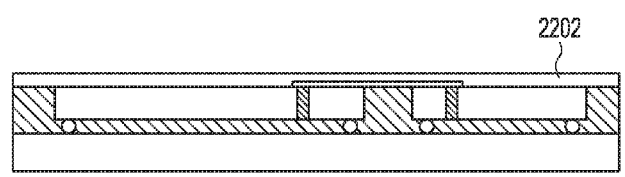

FIG. 22 illustrates a cross-sectional view of a subsequent step, where a layer 2202 is formed over the backside surfaces 112 and 116, including over conductive trace 904. In some embodiments, layer 2202 is a layer of dielectric material, such as a solder mask or polymer material, while in other embodiments, layer 2202 is an additional layer of mold compound 1802. Both embodiments provide electrical isolation for conductive traces 904.

Figure 23:
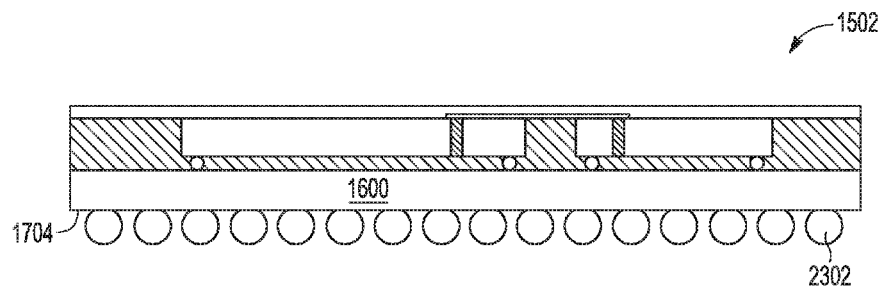

FIG. 23 illustrates a cross-sectional view of a subsequent step, where a number of solder balls 2302 are attached to respective pads on a bottom surface 1704 of substrate 1600 (e.g., solder ball placement and reflow). Substrate 1600 is analogous to substrate 1402. The resulting package (which includes system package 1700 and substrate 1600) is saw singulated into individual system packages.

Figure 24:
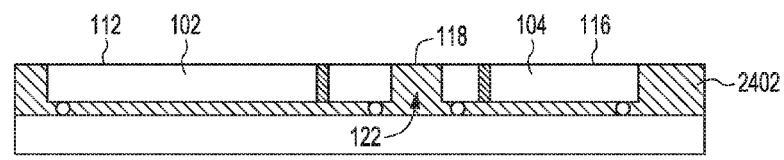
FIG. 24-26 illustrate block diagrams depicting alternative steps for a laser sintered interconnection process flow like that shown in FIG. 17-23, according to some embodiments.

FIG. 24 illustrates a cross-sectional view of an alternative embodiment that replaces the steps shown in FIGS. 18 and 20. FIG. 24 shows an exposed die molding process to surround die 102 and 104 with mold compound 2402, while leaving backside surfaces 112 and 116 exposed in the mold compound 2402. In some embodiments, the exposed die molding process uses film assisted molding (FAM), where a plastic film is loaded into a mold cavity and shaped as desired (e.g., a vacuum holds the film in place while the shape is solidified by application of heat, pressure, or both) before the system package is loaded into the mold cavity. The mold compound 2402 is then injected into the mold cavity, leaving backside surfaces 112 and 116 exposed and free of mold compound 2402. Such an embodiment avoids planarization or grinding of the package body, where such planarization or grinding may result in dishing of surface 118 between die 102 and 104 (e.g., surface 118 is not coplanar with surfaces 112 and 116), as discussed below in connection with FIG. 26. As shown in FIG. 24, top surface 118 is coplanar with backside surfaces 112 and 116. It is also noted that, by avoiding planarization and grinding, the exposed die molding process also prevents damage from occurring to the openings in the backside surfaces 112 and 116 that expose surfaces 1720 and 1724.

Figure 25:
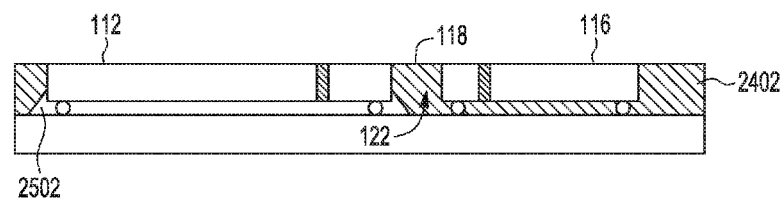

FIG. 25 illustrates a cross-sectional view of an alternative embodiment that replaces the steps shown in FIGS. 19 and 20. FIG. 25 shows an underfill process is performed to inject or otherwise provide encapsulant material 2502 (which is analogous to encapsulant material 1404) in the space between die 102 and substrate 1600 to cover and protect flip chip bumps 1706. While FIG. 25 shows that the underfill process is applied to die 102, the underfill process may be applied to both die 102 and 104. An exposed die molding process, such as one that uses FAM (discussed in connection with FIG. 24), is then performed to surround die 102 and 104 with mold compound 2402, leaving backside surface s112 and 116 exposed. It is noted that top surface 118 is coplanar with backside surfaces 112 and 116.

Figure 26:
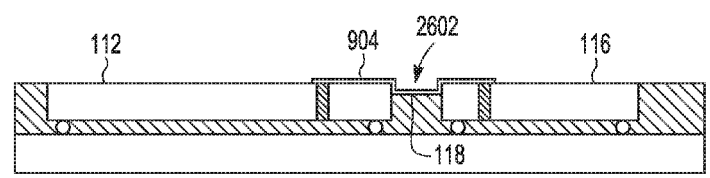

FIG. 26 illustrates a cross-section view of an embodiment in which top surface 118 is not coplanar with backside surfaces 112 and 116, which may occur as a result of dishing during planaration or mold top-side grinding of the package body, which often forms a concave surface 118 (such as during the step shown in FIG. 20). Even if such undesired dishing 2602 occurs, the laser sintered interconnection process is able to form a conductive trace 904 that extends along the dished top surface 118 between backside surfaces 112 and 116. It is noted that the laser sintered interconnection process is also able to form a conductive trace 904 even if surface 118 is vertically stepped down from backside surfaces 112 and 116 by some step height. In some embodiments, the laser sintered interconnection process is able to form conductive traces across step heights of up to 10 microns. It is also noted that the laser sintered interconnection process is able to form a conductive trace 904 from backside surface 112 to top surface 118 to backside surface 116, even if all three surfaces are non-coplanar (e.g., a first step height is present between surfaces 112 and 118, and a second step height is present between surfaces 116 and 118).

Figure 27:
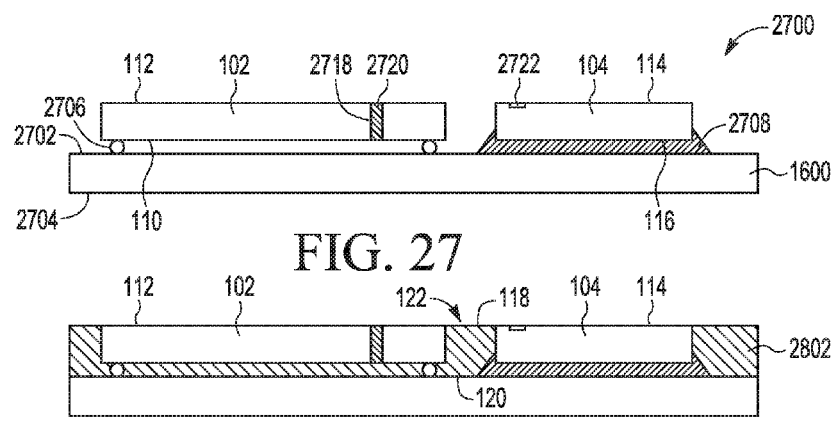
FIG. 27-32 illustrate block diagrams depicting another example laser sintered interconnection process flow in which the present disclosure is implemented, according to some embodiments.

FIG. 27-32 illustrate block diagrams depicting another example laser sintered interconnection process flow. FIG. 27 illustrates a cross-sectional view of microelectronic components, including die 102 and 104, of a system package 2700 that are mounted to substrate 1600. In the embodiment shown, die 102 is a flip chip die that has active surface 110 mounted face-down to substrate 1600, where flip chip bumps (represented by flip chip bumps 2706) are joined to respective pads on the top surface 2702 of substrate 1600. Also in the embodiment shown, die 104 has a backside 116 that is attached to the top surface 2702 of substrate 1600, with active surface 114 in a face-up orientation. Die 102 and 104 are positioned laterally to one another.

Die 104 is attached using die attach material 2708, which is a film or other material having sufficient adhesive strength to attach die 104 to substrate 1600 while withstanding the forces present during the remaining steps of the laser sintered interconnection process. In some embodiments, a thermal interface material (TIM) may be used as the die attach material, which is heat conductive. Examples of TIM include, but are not limited to, silicone or epoxy-resin based material containing suspended carbon nanotubes, or beryllium oxide, aluminum nitride, boron nitride, or diamond powders. In some embodiments, TIM can be a phase-change metal alloy, a grapheme-based adhesive, and the like.

Die 102 has a via in its inner net (represented by via 2718) and a corresponding bonding surface 2720. Die 104 has a bonding surface 2722, which may be a bond pad (like bond pad 1530) or a via surface (like surface 1538) on the active surface 114. A conductive trace is to be formed between surfaces 2720 and 2722.

Figure 28:
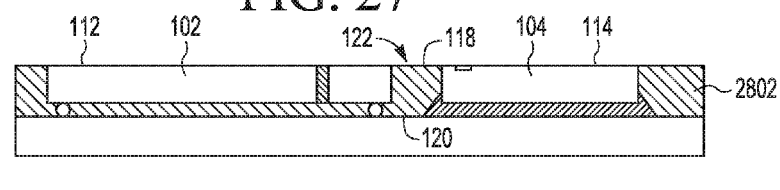

FIG. 28 illustrates a cross-sectional view of a subsequent step, where an exposed die molding process, such as one that uses FAM (discussed above), to surround die 102 and 104 with mold compound 2802, while leaving backside surface 112 and active surface 114 exposed in the mold compound 2802 and coplanar with a top surface 118 of portion 122 between die 102 and 104. Mold compound 2802 has a bottom surface 120 formed in contact with top surface 2702 of substrate 1600. Mold compound 2802 is analogous to mold compound 106.

Figure 29:
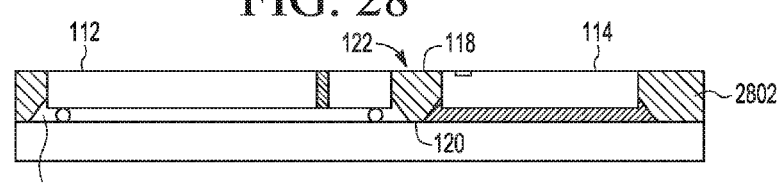

FIG. 29 illustrates a cross-sectional view of an alternative embodiment of the step shown in FIG. 28. FIG. 29 shows an underfill process is performed to inject or otherwise provide encapsulant material 2902 (which is analogous to encapsulant material 1404) in the space between die 102 and substrate 1600 to cover and protect flip chip bumps 2706. The exposed die molding process is then performed to surround die 102 and 104 with mold compound 2802.

Figure 30:
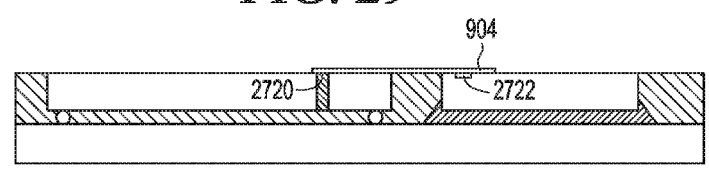

FIG. 30 illustrates a cross-sectional view of a subsequent step, where at least one conductive trace 904 is formed on the system package (which may be either system package illustrated in FIG. 28 or FIG. 29). A conductive trace 904 is formed between surface 2720 on backside surface 112 and surface 2722 on active surface 114, using the same laser sintered interconnection process discussed above.

Figure 31:
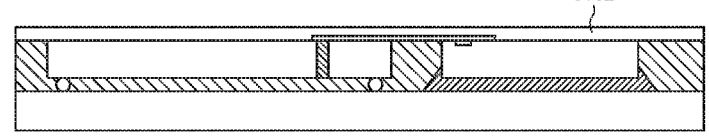

FIG. 31 illustrates a cross-sectional view of a subsequent step, where a layer 3102 is formed over the backside surface 112 and active surface 114, including over conductive trace 904. In some embodiments, layer 3102 is a layer of dielectric material, while in other embodiments, layer 3102 is an additional layer of mold compound 2802. Both embodiments provide electrical isolation for conductive traces 904.

Figure 32:
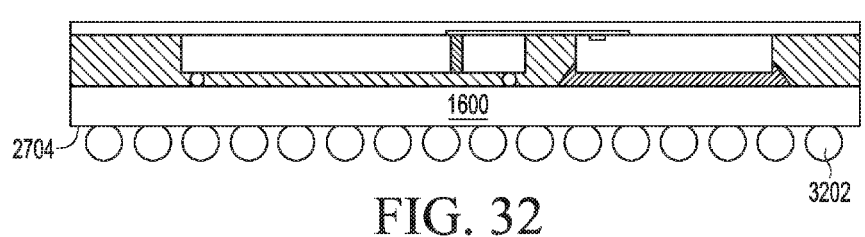

FIG. 32 illustrates a cross-sectional view of a subsequent step, where a number of solder balls 3202 are attached to respective pads on a bottom surface 2704 of substrate 1600 (e.g., solder ball placement and reflow). The resulting package (which includes system package 2700 and substrate 1600) is saw singulated into individual system packages.

By now it should be appreciated that there has been provided a laser sintered interconnection process for forming ultra-fine conductive traces as a redistribution layer over surfaces of a system package. The conductive traces are formed between a first bonding surface located on either an active surface or a backside surface of a first die and a second bonding surface located on either an active surface or a backside surface of a second die.

In one embodiment of the present disclosure, a microelectronic packaged device is provided, including: a system package including a first die and a second die, wherein the first die and the second die are laterally positioned to one another, and the first die and the second die are laterally separated from one another by electrically insulating material; and a conductive trace formed between a first conductive surface on an exposed surface of the first die and a second conductive surface on an exposed surface of the second die, wherein the conductive trace is laser sintered directly on the first conductive surface, on the exposed surface of the first die, on a top surface of the electrically insulating material, on the exposed surface of the second die, and on the second conductive surface.

One aspect of the above embodiment provides that the exposed surface of the first die includes an active surface of the first die, and the exposed surface of the second die includes an active surface of the second die.

A further aspect of the above embodiment provides that the first conductive surface of the first die includes one of a group including: a bond pad surface at the active surface of the first die, and a conductive layer surface exposed through passivation layers at the active surface of the first die; and the second conductive surface of the second die includes one of a group including: a bond pad surface at the active surface of the second die, and a conductive layer surface exposed through passivation layers at the active surface of the second die.

Another aspect of the above embodiment provides that the exposed surface of the first die includes a backside surface of the first die, and the exposed surface of the second die includes a backside surface of the second die.

A further aspect of the above embodiment provides that the first conductive surface of the first die includes a conductive layer surface exposed through silicon at the backside surface of the first die, and the second conductive surface of the second die includes a conductive layer surface exposed through silicon at the backside surface of the second die.

Another aspect of the above embodiment provides that the exposed surface of the first die includes a backside surface of the first die, and the exposed surface of the second die includes an active surface of the second die.

A further aspect of the above embodiment provides that the first conductive surface of the first die includes a conductive layer surface exposed through silicon at the backside surface of the first die, and the second conductive surface of the second die includes one of a group including: a bond pad surface at the active surface of the second die, and a conductive layer surface exposed through passivation layers at the active surface of the second die.

Another aspect of the above embodiment provides that the system package is part of an array panel that includes a plurality of system packages, and at least one respective conductive trace is formed on each of the plurality of system packages.

Another aspect of the above embodiment provides that the semiconductor device further includes: a substrate, wherein the system package is attached to a first surface of the substrate, and the substrate has a plurality of solder balls on a second surface opposing the first surface.

In another embodiment of the present disclosure, a method for fabricating a microelectronic packaged device is provided, the method including: depositing nanoparticle paste in an area over a face-up surface of a system package, wherein the system package includes at least a first die and a second die having minor sidewall surfaces surrounded by mold compound, the first and second die are laterally positioned to one another, the first die and the second die each have an exposed major surface at the face-up surface of the system package, and the area includes a target path between a first conductive surface on the exposed major surface of the first die and a second conductive surface on the exposed major surface of the second die, the target path crosses a face-up surface of a portion of the mold compound located between the first and second die; locating a position of the first and second conductive surfaces relative to one another using fiducial marks on the exposed major surfaces of the first and second die; and forming a conductive trace along the target path between the first and second conductive surfaces, wherein the conductive trace is laser sintered directly on the first conductive surface, on the exposed major surface of the first die, on the face-up surface of the portion of the mold compound, on the exposed major surface of the second die, and on the second conductive surface.

One aspect of the above embodiment provides that the method further includes: forming a plurality of solder bumps on pads on the exposed major surfaces of the first and second die subsequent to the forming the conductive trace, wherein the exposed major surfaces of the first and second die includes active surfaces of the first and second die; and attaching the active surfaces of the first and second die to a substrate to form electrical connections between the plurality of solder bumps and pads on the substrate.

A further aspect of the above embodiment provides that the first conductive surface of the first die includes one of a group including: a bond pad surface at the active surface of the first die, and a conductive layer surface exposed through passivation layers at the active surface of the first die; and the second conductive surface of the second die includes one of a group including: a bond pad surface at the active surface of the second die, and a conductive layer surface exposed through passivation layers at the active surface of the second die.

Another aspect of the above embodiment provides that the system package includes a substrate, the exposed major surface of the first die includes a backside surface, an active side surface of the first die is attached to the substrate.

A further aspect of the above embodiment provides that the exposed surface of the second die includes a backside surface of the second die, the first conductive surface of the first die includes a conductive layer surface exposed through silicon at the backside surface of the first die, and the second conductive surface of the second die includes a conductive layer surface exposed through silicon at the backside surface of the second die.

Another further aspect of the above embodiment provides that the exposed surface of the second die includes an active surface of the second die, the first conductive surface of the first die includes a surface of a first metal layer deposited during a back-end-of-line (BEOL) process, which is exposed through silicon at the backside surface of the first die, and the second conductive surface of the second die includes one of a group including: a bond pad surface at the active surface of the second die, and a surface of a last metal layer deposited during the BEOL process, which is exposed through passivation layers at the active surface of the second die.

Another aspect of the above embodiment provides that the method further includes: forming a plurality of conductive traces between the first die and the second die, wherein a width of each of the plurality of conductive traces includes 1 micron, and a pitch between each of the plurality of conductive traces includes 1 micron.

Another aspect of the above embodiment provides that the method further includes: depositing one of a dielectric layer or mold compound layer over the conductive trace.

In another embodiment of the present disclosure, a method for fabricating a microelectronic packaged device is provided, the method including: attaching a first die and a second die to a substrate, wherein the first die has an active surface electrically connected to the substrate, the second die has a first surface attached to the substrate, and the first and second die are laterally positioned to one another; forming an encapsulant over the substrate and at least around minor sidewall surfaces of the first and second die, wherein a backside surface of the first die and a second surface of the second die are exposed in the encapsulant, the second surface opposite the first surface of the second die; depositing nanoparticle paste in an area that includes a target path between a first conductive surface on the backside surface of the first die and a second conductive surface on the second surface of the second die, wherein the target path crosses a top surface of a portion of the encapsulant located between the first and second die; locating a position of the first and second conductive surfaces relative to one another using fiducial marks on the backside surface of the first die and the second surface of the second die; and forming a conductive trace along the target path between the first and second conductive surfaces, wherein the conductive trace is laser sintered directly on the first conductive surface, on the backside surface of the first die, on the top surface of the portion of the encapsulant, on the second surface of the second die, and on the second conductive surface.

One aspect of the above embodiment provides that the second surface of the second die includes a backside surface of the second die, and the forming the encapsulant includes: overmolding the first and second die, and grinding the encapsulant to expose the backside surface of the first die and the backside surface of the second die.

Another aspect of the above embodiment provides that the second surface of the second die includes an active surface of the second die, and the forming the encapsulant includes: underfilling the first and second die with the encapsulant to leave the backside surface of the first die and the active surface of the second die exposed.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, additional components may be included in each system package in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for fabricating a microelectronic packaged device, the method comprising:
   depositing nanoparticle paste in an area over a face-up surface of a system package, wherein
      the system package includes at least a first die and a second die having minor sidewall surfaces surrounded by mold compound, the first and second die are laterally positioned to one another, the first die and the second die each have an exposed major surface at the face-up surface of the system package, and
      the area includes a target path between a first conductive surface on the exposed major surface of the first die and a second conductive surface on the exposed major surface of the second die, the target path crosses a face-up surface of a portion of the mold compound located between the first and second die;
   locating a position of the first and second conductive surfaces relative to one another using fiducial marks on the exposed major surfaces of the first and second die; and
   forming a conductive trace along the target path between the first and second conductive surfaces, wherein the conductive trace is laser sintered directly on the first conductive surface, directly on the exposed major surface of the first die, directly on the face-up surface of the portion of the mold compound, directly on the exposed major surface of the second die, and directly on the second conductive surface, wherein the exposed major surface of the first die comprises a backside surface of the first die, and wherein the first die comprises an active surface opposite the backside surface.

2. The method of claim 1, wherein
the system package comprises a substrate, and
the active side surface of the first die is attached to the substrate.

3. The method of claim 2, wherein
the exposed surface of the second die comprises a backside surface of the second die,
the first conductive surface of the first die comprises a conductive layer surface exposed through silicon at the backside surface of the first die, and
the second conductive surface of the second die comprises a conductive layer surface exposed through silicon at the backside surface of the second die.

4. The method of claim 2, wherein
the exposed surface of the second die comprises an active surface of the second die,
the first conductive surface of the first die comprises a surface of a first metal layer deposited during a back-end-of-line (BEOL) process, which is exposed through silicon at the backside surface of the first die, and
the second conductive surface of the second die comprises one of a group including:
   a bond pad surface at the active surface of the second die, and
   a surface of a last metal layer deposited during the BEOL process, which is exposed through passivation layers at the active surface of the second die.

5. The method of claim 1, further comprising:
forming a plurality of conductive traces between the first die and the second die, wherein
   a width of each of the plurality of conductive traces comprises 1 micron, and
   a pitch between each of the plurality of conductive traces comprises 1 micron.

6. The method of claim 1, further comprising:
depositing one of a dielectric layer or mold compound layer over the conductive trace.

7. The method of claim 2, further comprising:
prior to forming the conductive trace:
   forming a plurality of solder bumps on pads on the active surface of the first die, and
   attaching the active surface of the first die to the substrate to form electrical connections between the plurality of solder bumps and pads on the substrate.

8. The method of claim 3, further comprising:
prior to forming the conductive trace:
   forming a plurality of solder bumps on pads on the active surface of the second die, and
   attaching the active surface of the second die to the substrate to form electrical connections between the plurality of solder bumps and pads on the substrate.

9. The method of claim 1, wherein
the second conductive surface of the second die comprises one of a group including:
   a surface of a first metal layer deposited during a back-end-of-line (BEOL) process, which is exposed through silicon at the backside surface of the second die, and
   a surface of a last metal layer deposited during the BEOL process, which is exposed through passivation layers at the active surface of the second die.

10. The method of claim 1, wherein
the system package is part of an array panel that comprises a plurality of system packages, and
at least one respective conductive trace is formed on each of the plurality of system packages.

11. A method for fabricating a microelectronic packaged device, the method comprising:
   attaching a first die and a second die to a substrate, wherein the first die has an active surface electrically connected to the substrate, the second die has a first surface attached to the substrate, and the first and second die are laterally positioned to one another;
   forming an encapsulant over the substrate and at least around minor sidewall surfaces of the first and second die, wherein a backside surface of the first die and a second surface of the second die are exposed in the encapsulant, the second surface opposite the first surface of the second die;
   depositing nanoparticle paste in an area that includes a target path between a first conductive surface on the backside surface of the first die and a second conductive surface on the second surface of the second die, wherein the target path crosses a top surface of a portion of the encapsulant located between the first and second die;

locating a position of the first and second conductive surfaces relative to one another using fiducial marks on the backside surface of the first die and the second surface of the second die; and forming a conductive trace along the target path between the first and second conductive surfaces, wherein the conductive trace is laser sintered directly on the first conductive surface, on the backside surface of the first die, on the top surface of the portion of the encapsulant, on the second surface of the second die, and on the second conductive surface.

12. The method of claim 11, wherein the second surface of the second die comprises a backside surface of the second die, and the forming the encapsulant comprises:
overmolding the first and second die, and
grinding the encapsulant to expose the backside surface of the first die and the backside surface of the second die.

13. The method of claim 11, wherein the second surface of the second die comprises an active surface of the second die, and the forming the encapsulant comprises:
underfilling the first and second die with the encapsulant to leave the backside surface of the first die and the active surface of the second die exposed.

* * * * *